US010192796B2

(12) United States Patent
Lin et al.

(10) Patent No.: US 10,192,796 B2
(45) Date of Patent: Jan. 29, 2019

(54) SEMICONDUCTOR DEVICE AND METHOD OF FORMING DUAL-SIDED INTERCONNECT STRUCTURES IN FO-WLCSP

(71) Applicant: STATS ChipPAC, Ltd., Singapore (SG)

(72) Inventors: Yaojian Lin, Singapore (SG); Kang Chen, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 68 days.

(21) Appl. No.: 13/832,205

(22) Filed: Mar. 15, 2013

(65) Prior Publication Data
US 2014/0077362 A1 Mar. 20, 2014

Related U.S. Application Data

(60) Provisional application No. 61/701,366, filed on Sep. 14, 2012.

(51) Int. Cl.
*H01L 23/48* (2006.01)
*H01L 23/52* (2006.01)
(Continued)

(52) U.S. Cl.
CPC ............ *H01L 22/32* (2013.01); *H01L 21/486* (2013.01); *H01L 21/4853* (2013.01);
(Continued)

(58) Field of Classification Search
CPC ....... H01L 25/0657; H01L 2924/01079; H01L 2224/16; H01L 2924/01029;
(Continued)

(56) References Cited

U.S. PATENT DOCUMENTS

| 4,955,523 A | 9/1990 | Calomagno et al. |
| 5,371,654 A | 12/1994 | Beaman et al. |

(Continued)

FOREIGN PATENT DOCUMENTS

CN 102637608 A 8/2012

*Primary Examiner* — Kimberly Rizkallah
*Assistant Examiner* — Dilinh Nguyen
(74) *Attorney, Agent, or Firm* — Robert D. Atkins; Patent Law Group: Atkins and Associates, P.C.

(57) ABSTRACT

A semiconductor device has a substrate with first and second conductive layers formed over first and second opposing surfaces of the substrate. A plurality of bumps is formed over the substrate. A semiconductor die is mounted to the substrate between the bumps. An encapsulant is deposited over the substrate and semiconductor die. A portion of the bumps extends out from the encapsulant. A portion of the encapsulant is removed to expose the substrate. An interconnect structure is formed over the encapsulant and semiconductor die and electrically coupled to the bumps. A portion of the substrate can be removed to expose the first or second conductive layer. A portion of the substrate can be removed to expose the bumps. The substrate can be removed and a protection layer formed over the encapsulant and semiconductor die. A semiconductor package is disposed over the substrate and electrically connected to the substrate.

23 Claims, 13 Drawing Sheets

(51) Int. Cl.
| | |
|---|---|
| *H01L 29/40* | (2006.01) |
| *H01L 21/66* | (2006.01) |
| *H01L 21/56* | (2006.01) |
| *H01L 23/498* | (2006.01) |
| *H01L 23/28* | (2006.01) |
| *H01L 23/00* | (2006.01) |
| *H01L 25/10* | (2006.01) |
| *H01L 23/31* | (2006.01) |
| *H01L 21/48* | (2006.01) |
| *H01L 21/78* | (2006.01) |
| *H01L 23/538* | (2006.01) |

(52) U.S. Cl.
CPC ............ *H01L 21/56* (2013.01); *H01L 21/565* (2013.01); *H01L 21/78* (2013.01); *H01L 22/12* (2013.01); *H01L 22/14* (2013.01); *H01L 22/20* (2013.01); *H01L 23/28* (2013.01); *H01L 23/3114* (2013.01); *H01L 23/3121* (2013.01); *H01L 23/3128* (2013.01); *H01L 23/49811* (2013.01); *H01L 23/49816* (2013.01); *H01L 23/49833* (2013.01); *H01L 23/5384* (2013.01); *H01L 23/5386* (2013.01); *H01L 23/5389* (2013.01); *H01L 24/13* (2013.01); *H01L 24/19* (2013.01); *H01L 24/97* (2013.01); *H01L 25/105* (2013.01); *H01L 23/49822* (2013.01); *H01L 23/5383* (2013.01); *H01L 2224/13025* (2013.01); *H01L 2224/16225* (2013.01); *H01L 2224/32225* (2013.01); *H01L 2224/48091* (2013.01); *H01L 2224/73204* (2013.01); *H01L 2224/73265* (2013.01); *H01L 2224/73267* (2013.01); *H01L 2224/81005* (2013.01); *H01L 2224/92125* (2013.01); *H01L 2224/92244* (2013.01); *H01L 2225/1023* (2013.01); *H01L 2225/1041* (2013.01); *H01L 2225/1058* (2013.01); *H01L 2924/01322* (2013.01); *H01L 2924/12041* (2013.01); *H01L 2924/12042* (2013.01); *H01L 2924/1305* (2013.01); *H01L 2924/1306* (2013.01); *H01L 2924/13091* (2013.01); *H01L 2924/15311* (2013.01); *H01L 2924/181* (2013.01); *H01L 2924/19105* (2013.01); *H01L 2924/19107* (2013.01)

(58) Field of Classification Search
CPC ............ H01L 2224/97; H01L 21/4853; H01L 21/486; H01L 21/56; H01L 21/565; H01L 21/78; H01L 22/12; H01L 23/28; H01L 23/31; H01L 23/3121; H01L 23/3128; H01L 23/49811; H01L 23/49816; H01L 23/49833; H01L 23/5384; H01L 23/5386; H01L 23/5389; H01L 24/13
USPC ....... 257/737, 685, 686, 777, 723, 778, 784, 257/787, 782
See application file for complete search history.

(56) References Cited

U.S. PATENT DOCUMENTS

| | | |
|---|---|---|
| 5,455,390 A | 10/1995 | DiStefano et al. |
| 5,495,667 A | 3/1996 | Farnworth et al. |
| 5,601,740 A | 2/1997 | Eldridge et al. |
| 5,635,767 A | 6/1997 | Wenzel et al. |
| 6,133,072 A | 10/2000 | Fjelstad |
| 6,207,549 B1 | 3/2001 | Higashi et al. |
| 6,476,503 B1 | 11/2002 | Imamura et al. |
| 6,477,768 B1 | 11/2002 | Wildner |
| 6,690,090 B2 | 2/2004 | Kimura |
| 6,972,496 B2 | 12/2005 | Choi |
| 7,227,095 B2 | 6/2007 | Roberts et al. |
| 7,271,497 B2 | 9/2007 | Joshi et al. |
| 7,497,694 B2 | 3/2009 | Kariya et al. |
| 7,608,921 B2 | 10/2009 | Pendse |
| 7,855,462 B2 * | 12/2010 | Boon et al. .................. 257/784 |
| 7,993,972 B2 | 8/2011 | Lin et al. |
| 7,994,431 B2 | 8/2011 | Yamano et al. |
| 8,035,210 B2 | 10/2011 | Yang et al. |
| 8,035,211 B2 | 10/2011 | Ko et al. |
| 8,138,017 B2 | 3/2012 | Chin |
| 8,174,119 B2 | 5/2012 | Pendse |
| 8,193,034 B2 | 6/2012 | Pagaila et al. |
| 8,466,544 B2 | 6/2013 | Pagaila |
| 2006/0084253 A1 | 4/2006 | Mizukoshi et al. |
| 2007/0108583 A1* | 5/2007 | Shim et al. .................. 257/686 |
| 2009/0008762 A1 | 1/2009 | Jung |
| 2009/0072375 A1 | 3/2009 | Song et al. |
| 2009/0261460 A1 | 10/2009 | Kuan et al. |
| 2009/0261466 A1 | 10/2009 | Pagaila et al. |
| 2009/0273094 A1 | 11/2009 | Ha et al. |
| 2009/0309212 A1 | 12/2009 | Shim et al. |
| 2010/0133675 A1 | 6/2010 | Yu et al. |
| 2010/0193928 A1 | 8/2010 | Zudock et al. |
| 2010/0214759 A1* | 8/2010 | Beddingfield .... H01L 23/49833 361/818 |
| 2010/0244222 A1 | 9/2010 | Chi et al. |
| 2010/0270656 A1 | 10/2010 | Do et al. |
| 2010/0327439 A1 | 12/2010 | Hwang et al. |
| 2011/0068444 A1* | 3/2011 | Chi .................. H01L 21/6835 257/669 |
| 2011/0204509 A1 | 8/2011 | Lin et al. |
| 2011/0241193 A1 | 10/2011 | Ding et al. |
| 2011/0278736 A1 | 11/2011 | Lin et al. |
| 2011/0285005 A1 | 11/2011 | Lin et al. |
| 2012/0001328 A1 | 1/2012 | Chang et al. |
| 2012/0012990 A1 | 1/2012 | Pagaila et al. |
| 2012/0018897 A1 | 1/2012 | Park et al. |
| 2012/0018900 A1 | 1/2012 | Pagaila et al. |
| 2012/0038064 A1 | 2/2012 | Camacho et al. |
| 2012/0049366 A1 | 3/2012 | Zeng |
| 2012/0056329 A1 | 3/2012 | Pagaila et al. |
| 2012/0074585 A1 | 3/2012 | Koo et al. |
| 2012/0119388 A1 | 5/2012 | Cho et al. |
| 2012/0199972 A1 | 8/2012 | Pagaila et al. |
| 2012/0217645 A1 | 8/2012 | Pagaila |
| 2012/0273947 A1 | 11/2012 | Mo |
| 2012/0273960 A1 | 11/2012 | Park et al. |
| 2013/0147041 A1* | 6/2013 | Chan et al. .................. 257/738 |
| 2013/0249080 A1 | 9/2013 | Lin et al. |
| 2013/0270682 A1 | 10/2013 | Hu et al. |
| 2013/0292850 A1 | 11/2013 | Chua et al. |

* cited by examiner

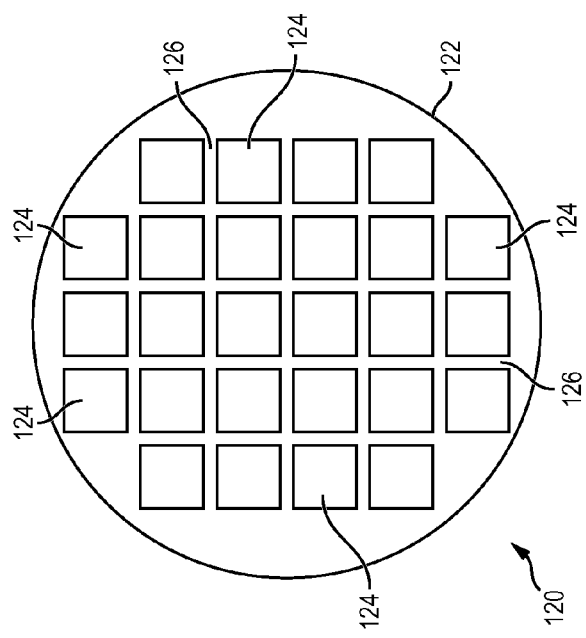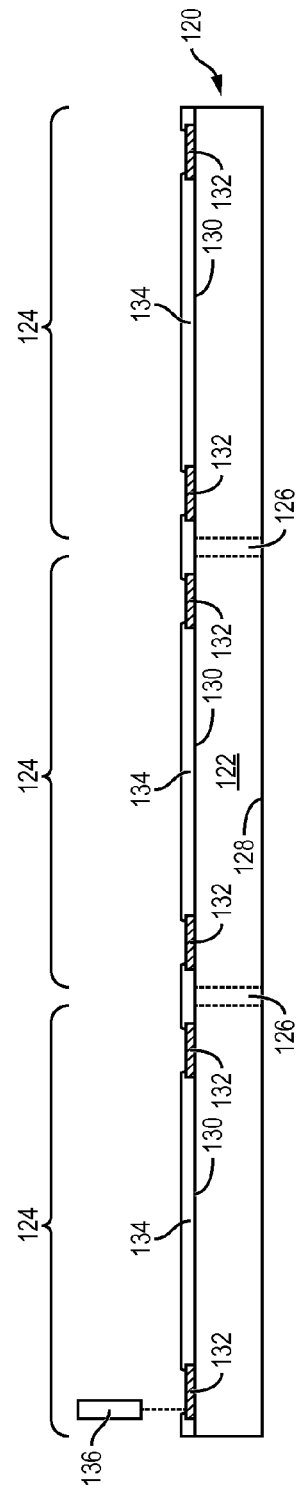

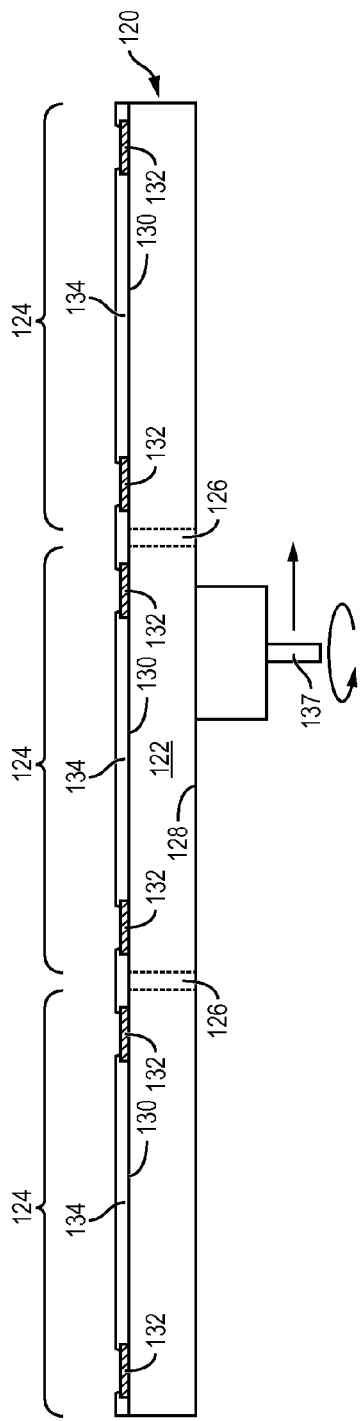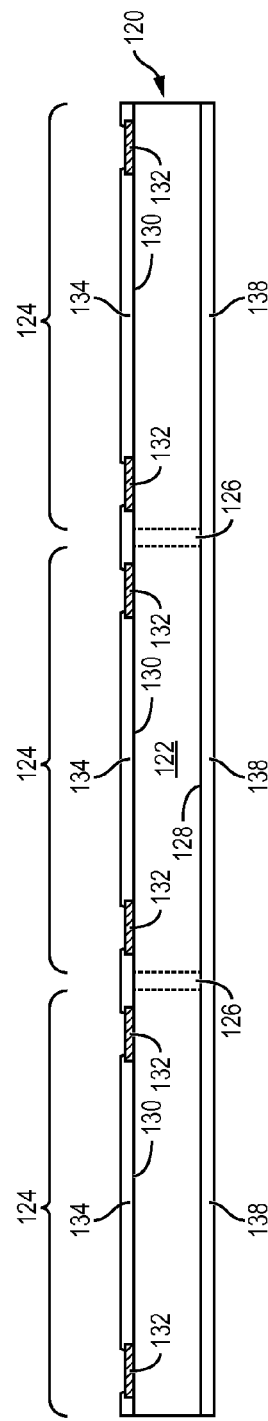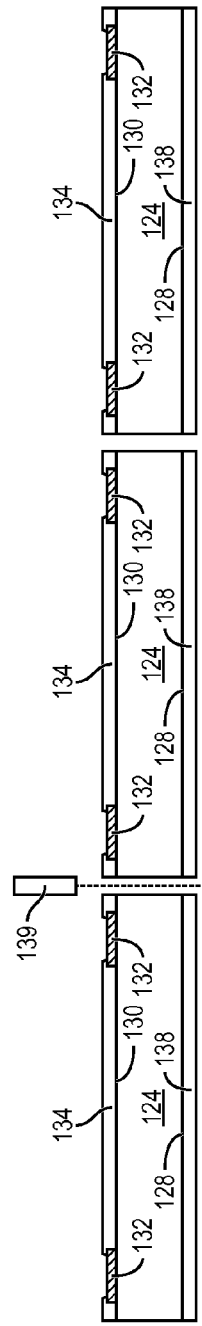
FIG. 3c
FIG. 3d
FIG. 3e

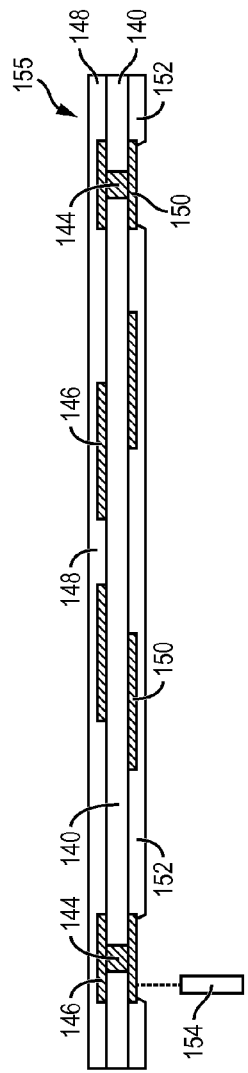
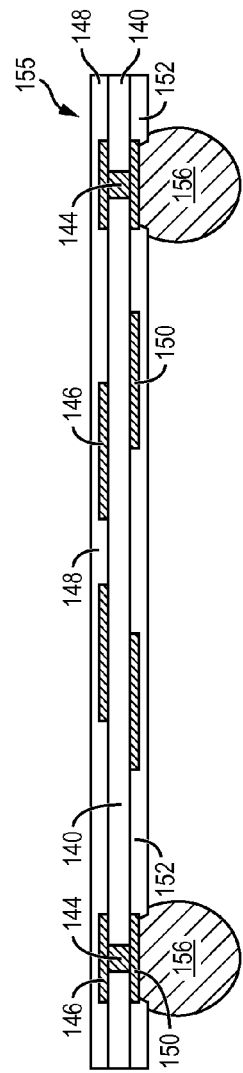
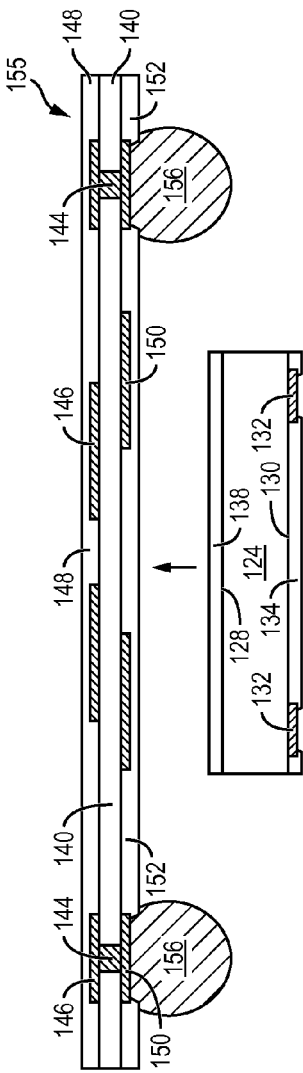
FIG. 4a
FIG. 4b
FIG. 4c

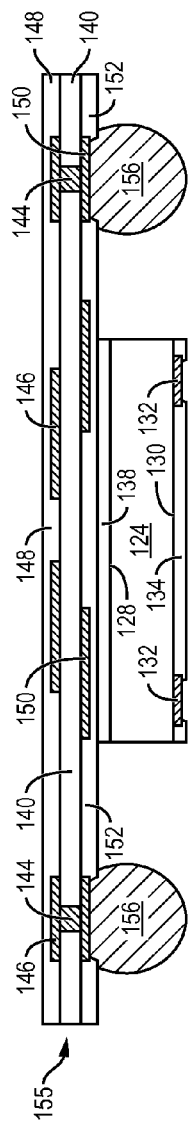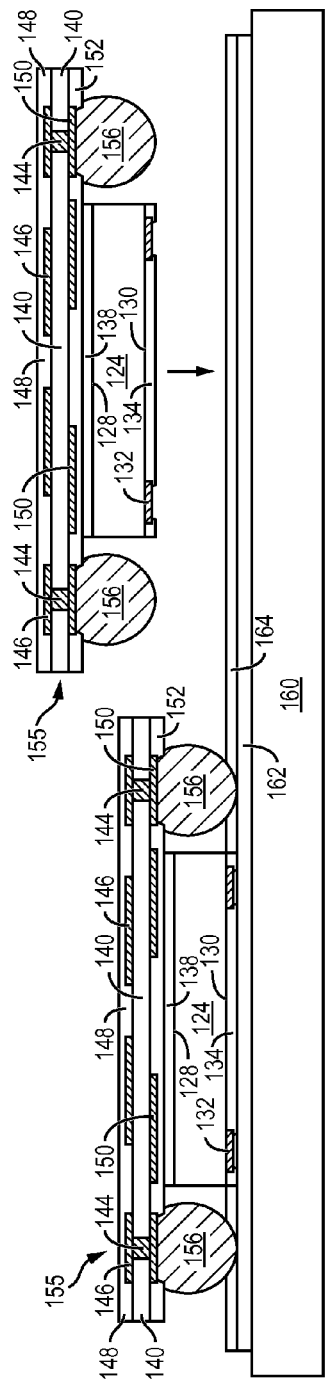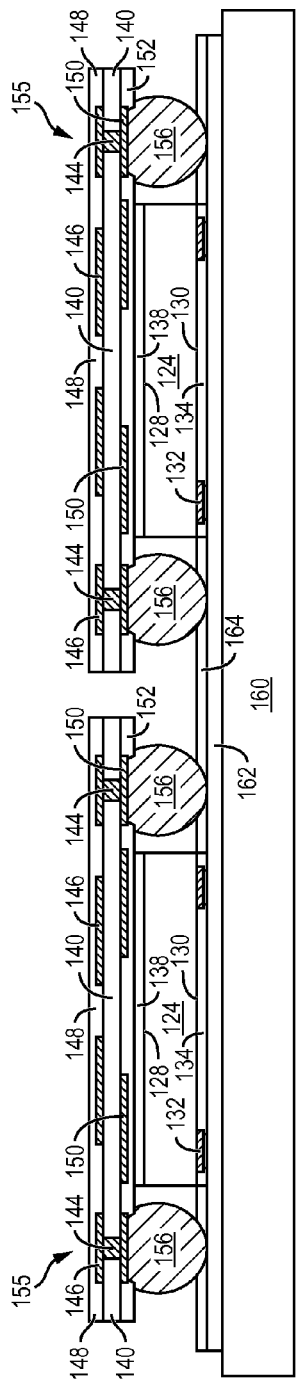

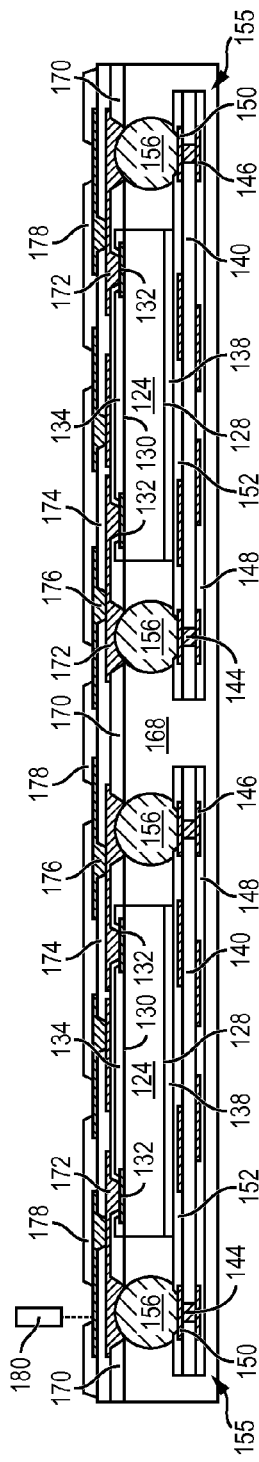
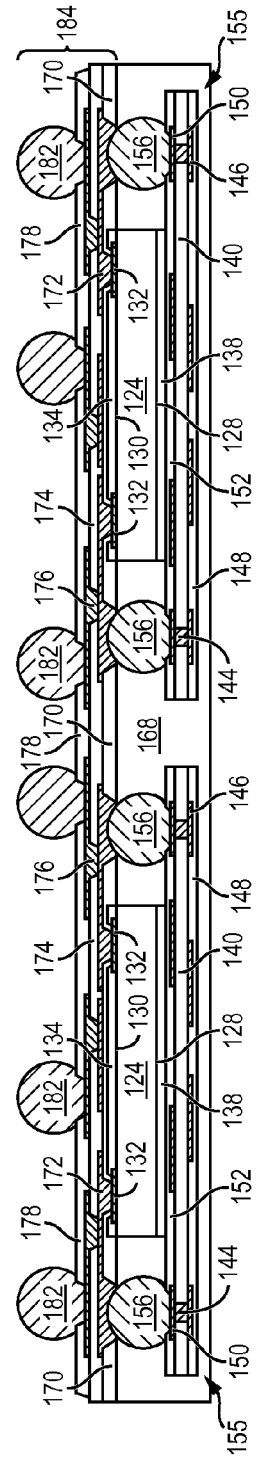
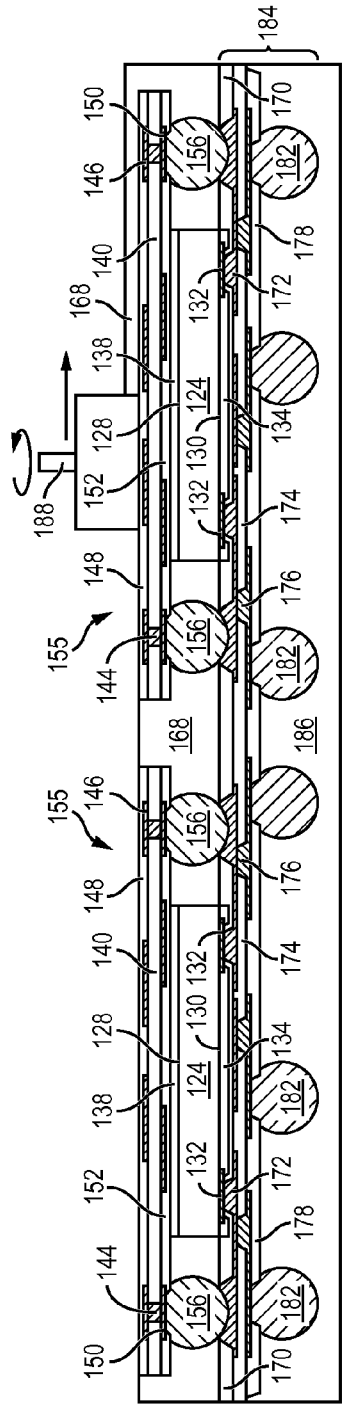
FIG. 5e
FIG. 5f
FIG. 5g

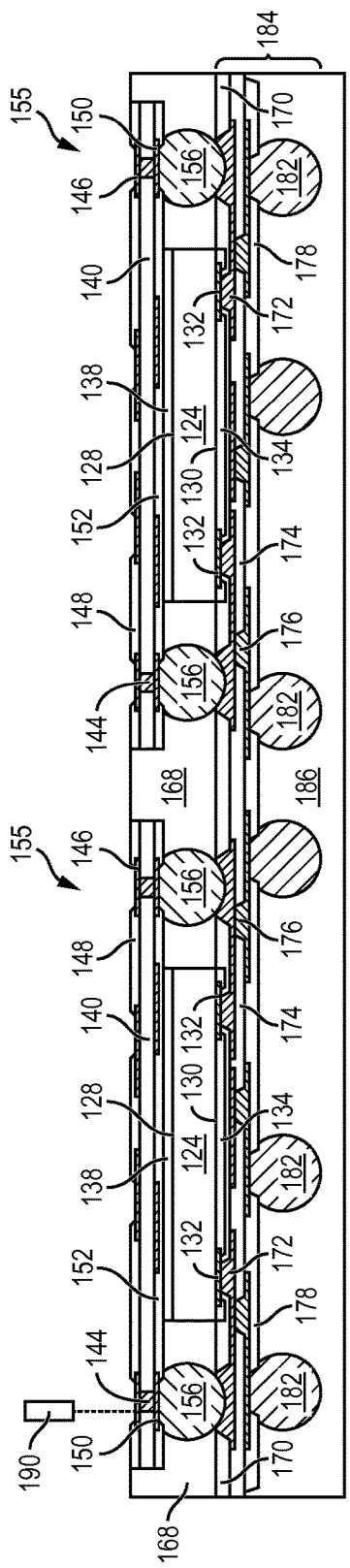
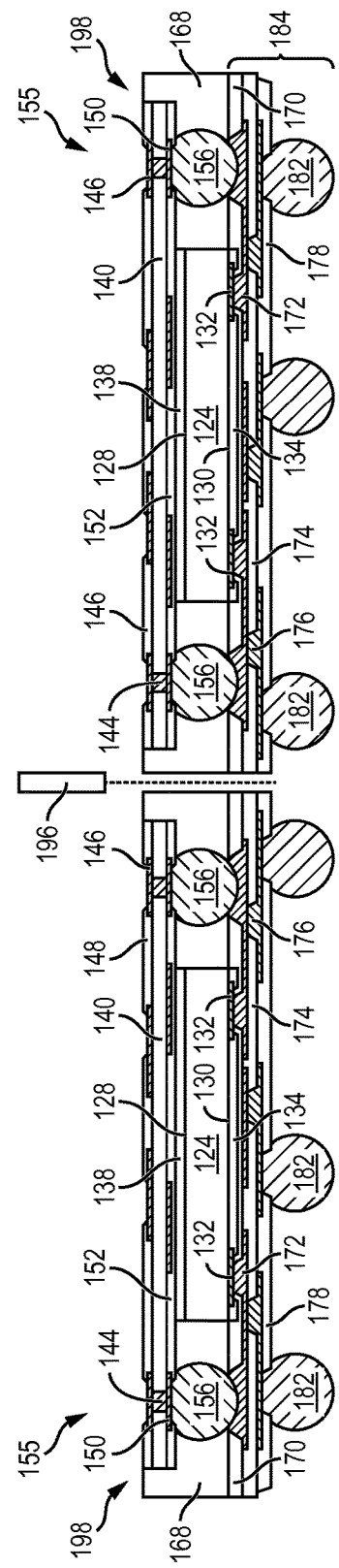
FIG. 5h
FIG. 5i

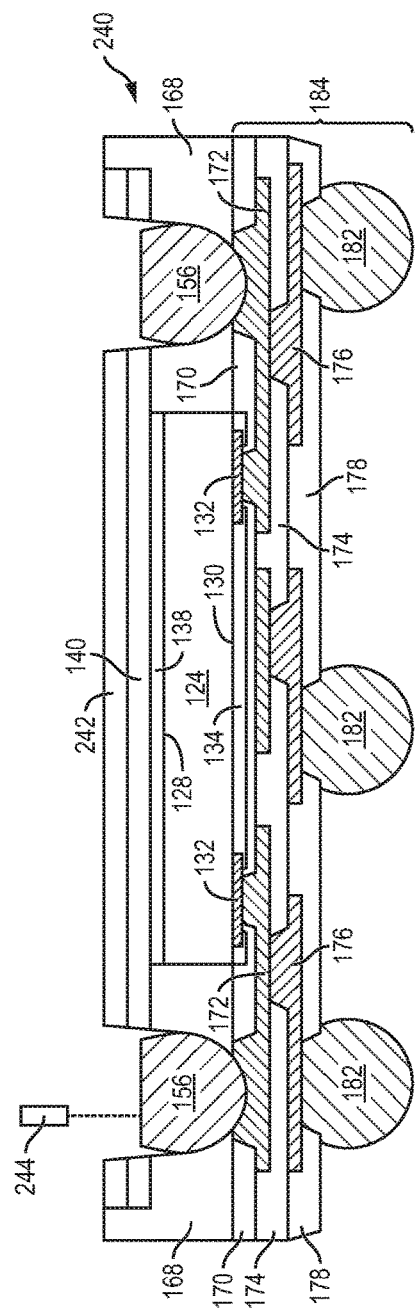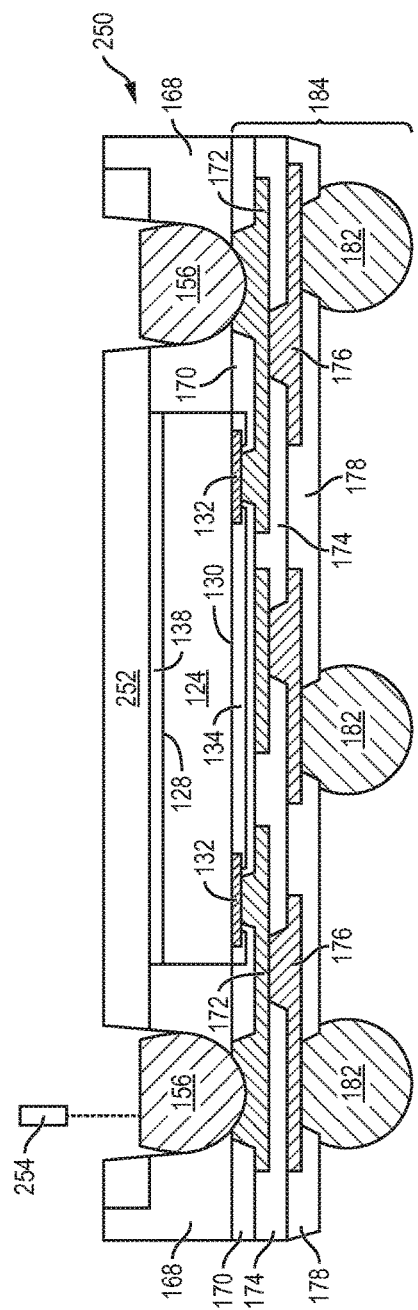

SEMICONDUCTOR DEVICE AND METHOD OF FORMING DUAL-SIDED INTERCONNECT STRUCTURES IN FO-WLCSP

CLAIM TO DOMESTIC PRIORITY

The present application claims the benefit of U.S. Provisional Application No. 61/701,366, filed Sep. 14, 2012, which application is incorporated herein by reference.

CROSS REFERENCE TO RELATED APPLICATIONS

The present application is related to U.S. patent application Ser. No. 13/832,118, now U.S. Pat. No. 9,385,052, filed Mar. 15, 2013, entitled "Semiconductor Device and Method of Forming Build-up Interconnect Structure over Carrier for Testing at Interim stages." The present application is further related to U.S. patent application Ser. No. 13/832,449, filed Mar. 15, 2013, entitled "Semiconductor Device and Method of Forming Dual-Sided Interconnect Structures in FO-WLCSP".

FIELD OF THE INVENTION

The present invention relates in general to semiconductor devices and, more particularly, to a semiconductor device and method of forming dual-sided interconnect structures in Fo-WLCSP.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Semiconductor die often require a top and bottom build-up interconnect structure in a fan-out wafer level chip scale package (Fo-WLCSP) for electrical connection to external devices. The build-up interconnect structures are typically formed layer-by-layer on both sides of the Fo-WLCSP. The layer-by-layer formation of the build-up interconnect structures requires long cycle time and high manufacturing cost due to the industry standard temporary bonding processes. The temporary bonding can lower manufacturing yield and increase defects.

SUMMARY OF THE INVENTION

A need exists for a simple and cost effective dual-sided interconnect structure in a Fo-WLCSP. Accordingly, in one embodiment, the present invention is a method of making a semiconductor device comprising the steps of providing a substrate including first and second conductive layers formed over first and second opposing surfaces of the substrate, forming a plurality of bumps over the substrate, mounting a semiconductor die to the substrate between the bumps, depositing an encapsulant over the substrate and semiconductor die, and forming an interconnect structure over the encapsulant and semiconductor die and electrically coupled to the bumps.

In another embodiment, the present invention is a method of making a semiconductor device comprising the steps of providing a substrate, forming a vertical interconnect structure over the substrate, mounting a semiconductor die to the substrate, depositing an encapsulant over the substrate and semiconductor die, and forming a first interconnect structure over the encapsulant and semiconductor die.

In another embodiment, the present invention is a semiconductor device comprising a substrate and vertical interconnect structure formed over the substrate. A semiconductor die is mounted to the substrate. An encapsulant is deposited over the substrate and semiconductor die. A first interconnect structure is formed over the encapsulant and semiconductor die.

In another embodiment, the present invention is a semiconductor device comprising a substrate and semiconductor die mounted to the substrate. An encapsulant is deposited over the substrate and semiconductor die. A first interconnect structure is formed over the encapsulant and semiconductor die.

BRIEF DESCRIPTION OF THE DRAWINGS

FIGS. 3a-3e illustrate a semiconductor wafer with a plurality of semiconductor die separated by a saw street;

FIGS. 4a-4d illustrate a process of forming an interposer substrate with a semiconductor die mounted to the substrate;

FIGS. 5a-5i illustrate a process of forming the interposer substrate and a build-up interconnect structure as the dual-sided interconnect structures in a Fo-WLCSP;

FIG. 9 illustrates the interposer substrate with exposed side surfaces of the bumps; and FIG. 10 illustrates the interposer substrate with a laminated protection layer.

DETAILED DESCRIPTION OF THE DRAWINGS

Figure 1:
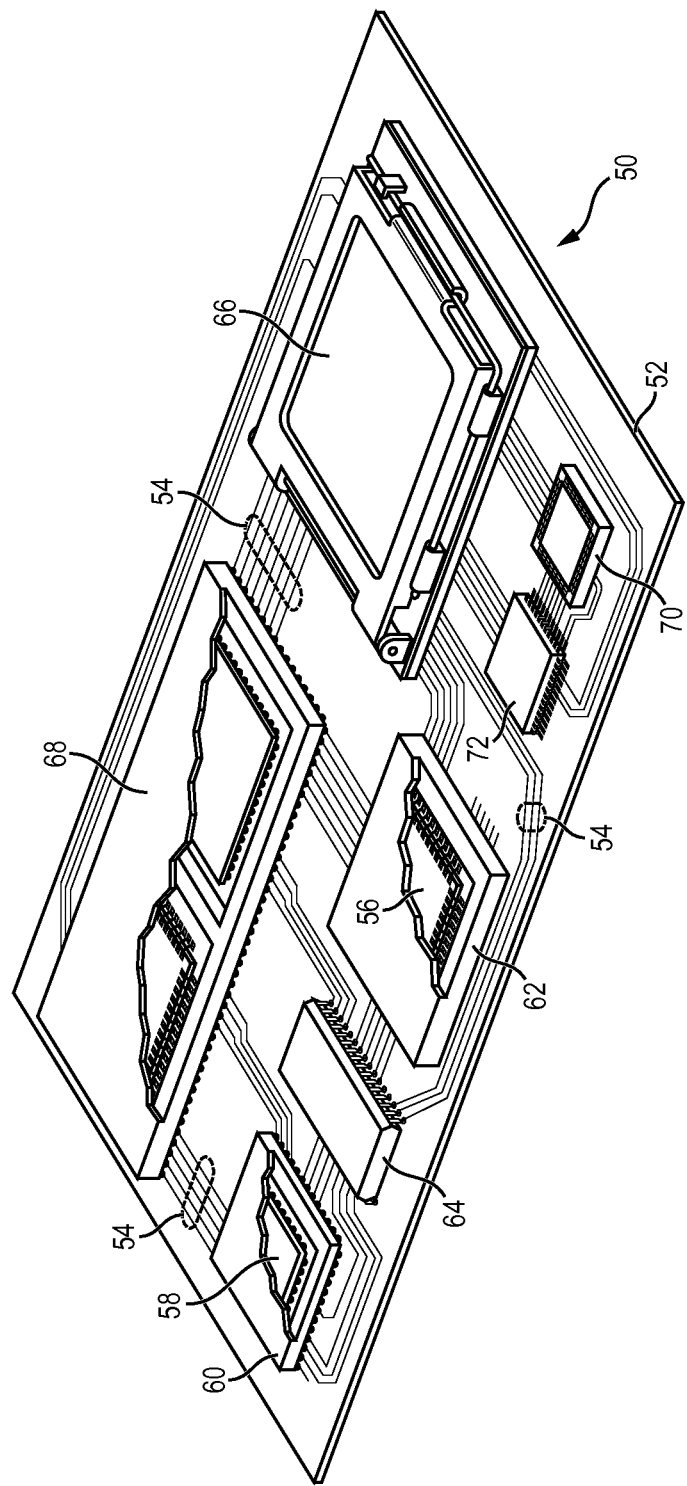
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for the products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
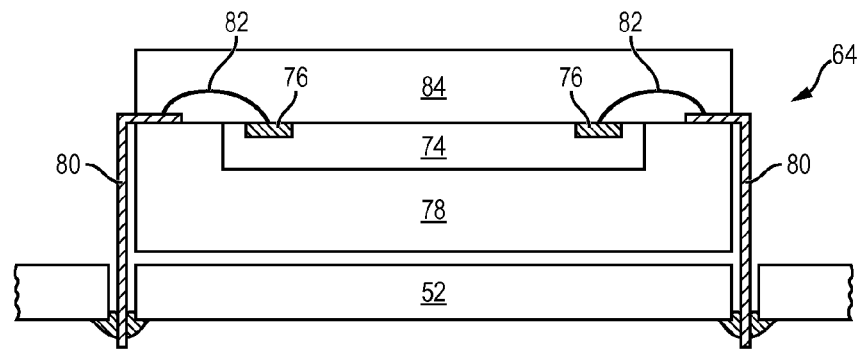
FIGS. 2a-2c illustrate further detail of the representative semiconductor packages mounted to the PCB.
Figure 2B:
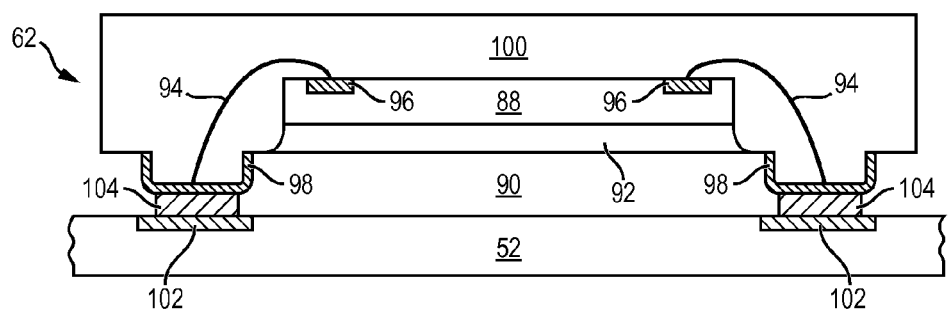
Figure 2C:
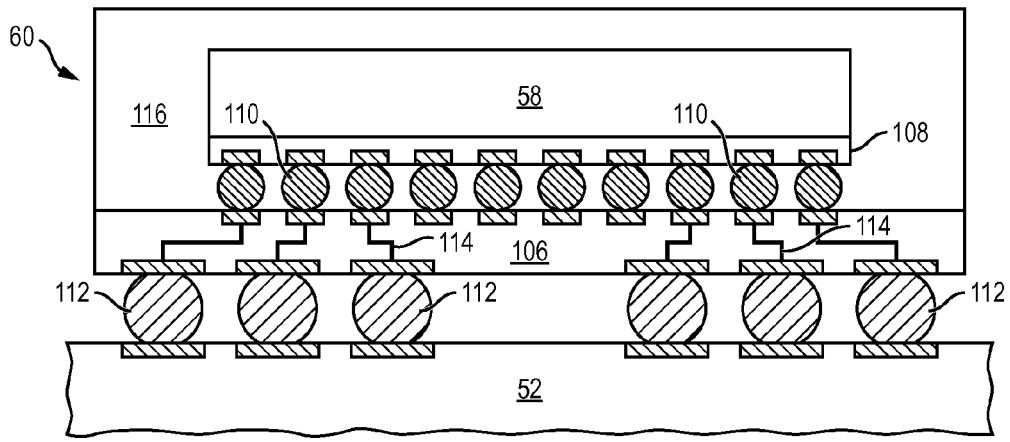

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 3b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

An insulating or passivation layer 134 is formed over active surface 130 and conductive layer 132 using PVD, CVD, printing, spin coating, spray coating, sintering or thermal oxidation. The insulating layer 134 contains one or more layers of silicon dioxide (SiO2), silicon nitride (Si3N4), silicon oxynitride (SiON), tantalum pentoxide (Ta2O5), aluminum oxide (Al2O3), or other material having similar structural and insulating properties. A portion of insulating layer 134 is removed by laser direct ablation (LDA) using laser 136 to expose conductive layer 132. Alternatively, a portion of insulating layer 134 is removed by an etching process through a patterned photoresist layer to expose conductive layer 132.

In FIG. 3c, back surface 128 of semiconductor wafer 120 undergoes a backgrinding operation using grinder 137 followed by a polishing step to reduce the thickness of the wafer. In FIG. 3d, a die attach adhesive film or tape 138 is laminated to the polished back surface 128 prior to singulation.

In FIG. 3e, semiconductor wafer 120 is singulated through saw street 126 using a saw blade or laser cutting tool 139 into individual semiconductor die 124.

FIGS. 4a-4d illustrate formation of an interposer substrate with a semiconductor die mounted to the substrate. FIG. 4a shows a core substrate 140 including one or more laminated layers of polytetrafluoroethylene pre-impregnated (prepreg), FR-4, FR-1, CEM-1, or CEM-3 with a combination of phenolic cotton paper, epoxy, resin, woven glass, matte glass, polyester, and other reinforcement fibers or fabrics. Alternatively, core substrate 140 contains one or more insulating or dielectric layers.

A plurality of through vias is formed through core substrate 140 using laser drilling, mechanical drilling, or deep reactive ion etching (DRIE). The vias are filled with Al, Cu, Sn, Ni, Au, Ag, titanium (Ti), tungsten (W), or other suitable electrically conductive material using electrolytic plating, electroless plating process, or other suitable deposition process to form z-direction vertical interconnect conductive vias 144. In one embodiment, Cu is deposited over the sidewall of the through vias by electroless plating and electroplating. The through vias are filled with conductive paste or plugging resin with fillers.

An electrically conductive layer or redistribution layer (RDL) 146 is formed over a first surface of core substrate 140 and conductive vias 144 using a patterning and metal deposition process such as Cu foil lamination, printing, PVD, CVD, sputtering, electrolytic plating, and electroless plating. Conductive layer 146 includes one or more layers of Al, Cu, Sn, Ni, Au, Ag, or other suitable electrically conductive material. Conductive layer 146 is electrically connected to conductive vias 144.

An insulating or passivation layer 148 is formed over the first surface of core substrate 140 and conductive layer 146 using PVD, CVD, printing, spin coating, spray coating, sintering or thermal oxidation. The insulating layer 148 contains one or more layers of SiO2, Si3N4, SiON, Ta2O5, Al2O3, hafnium oxide (HfO2), benzocyclobutene (BCB), polyimide (PI), polybenzoxazoles (PBO), polymer dielectric resist with or without fillers or fibers, or other material having similar structural and dielectric properties.

An electrically conductive layer or RDL 150 is formed over conductive vias 144 and a second surface of core substrate 140 opposite the first surface using a patterning and metal deposition process such as Cu foil lamination, printing, PVD, CVD, sputtering, electrolytic plating and electroless plating. Conductive layer 150 includes one or more layers of Al, Cu, Sn, Ni, Au, Ag, or other suitable electrically conductive material. Conductive layer 150 is electrically connected to conductive vias 144 and conductive layer 146. In another embodiment, conductive vias 144 are formed through core substrate 140 after forming conductive layer 146 and/or conductive layer 150.

An insulating or passivation layer 152 is formed over the second surface of core substrate 140 and conductive layer 150 using PVD, CVD, printing, spin coating, spray coating, sintering or thermal oxidation. The insulating layer 152 contains one or more layers of SiO2, Si3N4, SiON, Ta2O5, Al2O3, HfO2, BCB, PI, PBO, polymer dielectric resist with or without fillers or fibers, or other material having similar structural and dielectric properties. A portion of insulating layer 152 is removed by LDA using laser 154 to expose conductive layer 150. Alternatively, a portion of insulating layer 152 is removed by an etching process through a patterned photoresist layer to expose conductive layer 150.

The resulting interposer substrate 155 provides electrical interconnect vertically and laterally across the substrate through conductive layers 146 and 150 and conductive vias 144 according to the electrical function of semiconductor die 124. Substrate 155 is inspected and tested to be known good by open/short probe or auto-scope inspection at an interim stage, i.e., prior to mounting semiconductor die 124. Portions of conductive layers 146 and 150 and conductive vias 144 are electrically common or electrically isolated according to the design and function of semiconductor die 124.

Substrate 155 can also be a multi-layer flexible laminate, ceramic, copper foil, glass, or semiconductor wafer including an active surface containing one or more transistors, diodes, and other circuit elements to implement analog circuits or digital circuits.

In FIG. 4b, an electrically conductive bump material is deposited over conductive layer 150 using an evaporation, electrolytic plating, electroless plating, ball drop, or screen printing process. The bump material can be Al, Sn, Ni, Au, Ag, lead (Pb), Bi, Cu, solder, and combinations thereof, with an optional flux solution. For example, the bump material can be eutectic Sn/Pb, high-lead solder, Cu core solder ball, Cu ball with solder paste in ball mounting, or lead-free solder. The bump material is bonded to conductive layer 150 using a suitable attachment or bonding process. In one embodiment, the bump material is reflowed by heating the material above its melting point to form balls or bumps 156. In some applications, bumps 156 are reflowed a second time to improve electrical contact to conductive layer 150. In one embodiment, bumps 156 are formed over a UBM having a wetting layer, barrier layer, and adhesive layer. Bumps 156 can also be compression bonded or thermocompression bonded to conductive layer 150. Bumps 156 represent one type of interconnect structure that can be formed over conductive layer 150. The interconnect structure can also use bond wires, conductive paste, stud bump, micro bump, or other electrical interconnect.

In FIG. 4c, semiconductor die 124 from FIG. 3c is mounted to interposer substrate 155 using, for example, a pick and place operation with back surface 128 oriented toward the substrate. Semiconductor die 124 are secured to substrate 155 with die attach adhesive or film 138. FIG. 4d shows semiconductor die 124 mounted to substrate 155 and disposed between and at least partially within a height of bumps 156. Semiconductor die 124 is a known good die (KGD) having been tested prior to mounting to substrate 155. Substrate 155 has sufficient size to accommodate multiple semiconductor die. Substrate 155 is singulated into individual semiconductor die 124, each with associated interposer substrate 155 and bumps 156. No additional polishing is required to save cost and reduce cycle time.

Figure 5C:
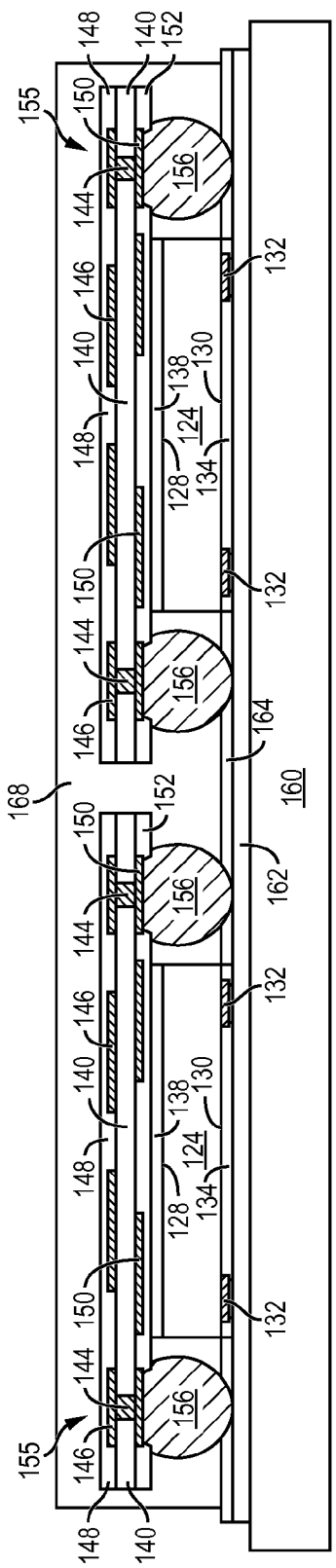

FIGS. 5a-5i illustrate, in relation to FIGS. 1 and 2a-2c, a process of forming the interposer substrate and a build-up interconnect structure as the dual-sided interconnect structures in a Fo-WLCSP. FIG. 5a shows a carrier or temporary substrate 160 containing reusable or sacrificial base material such as silicon, polymer, beryllium oxide, glass, or other suitable low-cost, rigid material for structural support. An interface layer or double-sided tape 162, including optional additional adhesive or compressible releasing layer 164, is formed over carrier 160 as a temporary adhesive bonding film, etch-stop layer, or thermal release layer. Substrate 155 is mounted to compressible releasing film 164 on carrier 160 with bumps 156 oriented toward the carrier. FIG. 5b shows substrate 155 with semiconductor die 124 mounted to carrier 160. Conductive layer 132 and insulating layer 134 of semiconductor die 124, as well as an optional portion of bumps 156, are embedded with compressible releasing film 164 on carrier 160.

In FIG. 5c, an encapsulant or molding compound 168 is deposited over carrier 160, substrate 155, and semiconductor die 124 using a paste printing, compressive molding, transfer molding, liquid encapsulant molding, vacuum lamination, spin coating, or other suitable applicator. Encapsulant 168 can be polymer composite material, such as epoxy resin with filler, epoxy acrylate with filler, or polymer with proper filler. In one embodiment, encapsulant 168 is dispensed at an intersection of four adjacent substrate 155. Encapsulant 168 is non-conductive and environmentally protects the semiconductor device from external elements and contaminants. In particular, the filler and coefficient of thermal expansion (CTE) of encapsulant 168 is selected to aid with gap filling, warpage control and reliability.

Figure 5D:
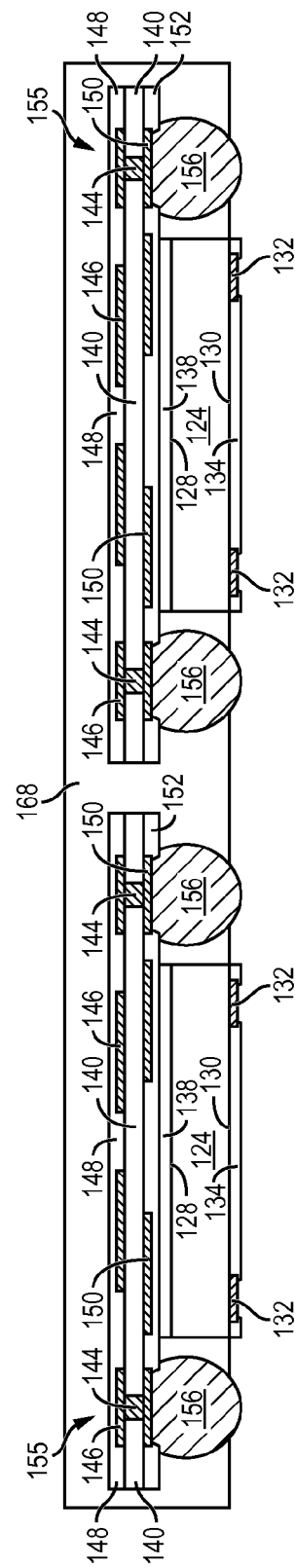

In FIG. 5d, carrier 160, interface layer 162, and compressible releasing film 164 are removed by chemical etching, mechanical peeling, chemical mechanical planarization (CMP), mechanical grinding, thermal bake, UV light, laser scanning, or wet stripping, leaving conductive layer 132 and insulating layer 134 of semiconductor die 124 and a portion of bumps 156 exposed from encapsulant 168. Additional back grinding may be applied to control the warpage. Optional laser shallow drilling or cleaning may be applied to expose bumps 156 for interconnection or good contact resistance.

In FIG. 5e, an insulating or passivation layer 170 is formed over semiconductor die 124, bumps 156, and encapsulant 168 using PVD, CVD, printing, slit coating, spin coating, spray coating, lamination, sintering or thermal oxidation. The insulating layer 170 contains one or more layers of SiO2, Si3N4, SiON, Ta2O5, Al2O3, polymer dielectric resist with or without fillers or fibers, or other material having similar structural and insulating properties. A portion of insulating layer 170 is removed by LDA to expose conductive layer 132 and bumps 156. Alternatively, a portion of insulating layer 170 is removed through a patterned photoresist layer to expose conductive layer 132 and bumps 156.

An electrically conductive layer 172 is formed over conductive layer 132, bumps 156, and insulating layer 170 using PVD, CVD, electrolytic plating, electroless plating process, or other suitable metal deposition process. Conductive layer 172 can be one or more layers of Al, Ti, TiW, Cu, Sn, Ni, Au, Ag, or other suitable electrically conductive material. One portion of conductive layer 172 is electrically connected to conductive layer 132. Another portion of conductive layer 172 is electrically connected to bumps 156. Other portions of conductive layer 172 can be electrically common or electrically isolated depending on the design and function of semiconductor die 124.

An insulating or passivation layer 174 is formed over insulating layer 170 and conductive layer 172 using PVD, CVD, printing, spin coating, spray coating, slit coating, lamination, sintering or thermal oxidation. The insulating layer 174 contains one or more layers of SiO2, Si3N4, SiON, Ta2O5, Al2O3, polymer dielectric resist with or without fillers or fibers, or other material having similar structural and insulating properties. A portion of insulating layer 174 is removed by LDA or etching process through a patterned photoresist layer to expose conductive layer 172.

An electrically conductive layer 176 is formed over conductive layer 172 and insulating layer 174 using PVD, CVD, electrolytic plating, electroless plating process, or other suitable metal deposition process. Conductive layer 176 can be one or more layers of Al, Ti, TiW, Cu, Sn, Ni, Au, Ag, or other suitable electrically conductive material. One portion of conductive layer 176 is electrically connected to conductive layer 172. Other portions of conductive layer 176 can be electrically common or electrically isolated depending on the design and function of semiconductor die 124.

An insulating or passivation layer 178 is formed over insulating layer 174 and conductive layer 176 using PVD, CVD, printing, spin coating, spray coating, slit coating, lamination, sintering or thermal oxidation. The insulating layer 178 contains one or more layers of SiO2, Si3N4, SiON, Ta2O5, Al2O3, polymer dielectric resist with or without fillers or fibers, or other material having similar structural and insulating properties. A portion of insulating layer 178 is removed by LDA using laser 180 to expose conductive layer 176. Alternatively, a portion of insulating layer 178 is removed by an etching process through a patterned photoresist layer to expose conductive layer 176.

In FIG. 5f, an electrically conductive bump material is deposited over the exposed conductive layer 176 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 176 using a suitable attachment or bonding process. In one embodiment, the bump material is reflowed by heating the material above its melting point to form balls or bumps 182. In some applications, bumps 182 are reflowed a second time to improve electrical contact to conductive layer 176. In one embodiment, bumps 182 are formed over a UBM having a wetting layer, barrier layer, and adhesive layer. Bumps 182 can also be compression bonded or thermocompression bonded to conductive layer 176. Bumps 182 represent one type of interconnect structure that can be formed over conductive layer 172. The interconnect structure can also use bond wires, conductive paste, stud bump, micro bump, or other electrical interconnect.

The combination of insulating layers 170, 174, and 178 and conductive layers 172 and 176 and bumps 182 constitutes a build-up interconnect structure 184. The build-up interconnect structures 184 is inspected and tested to be known good before additional device integration.

In FIG. 5g, a backgrinding or support tape 186 is applied over insulating layer 178 and bumps 182. A portion of encapsulant 168 is removed in a grinding operation with grinder 188 to planarize the surface and expose insulating layer 148 of substrate 155. A chemical etch or CMP process can also be used to remove mechanical damage resulting from the grinding operation and planarize encapsulant 168.

In FIG. 5h, a portion of insulating layer 148 is removed by LDA using laser 190 to expose conductive layer 146 of substrate 155 for electrical interconnect to external semiconductor devices.

Figure 6A:
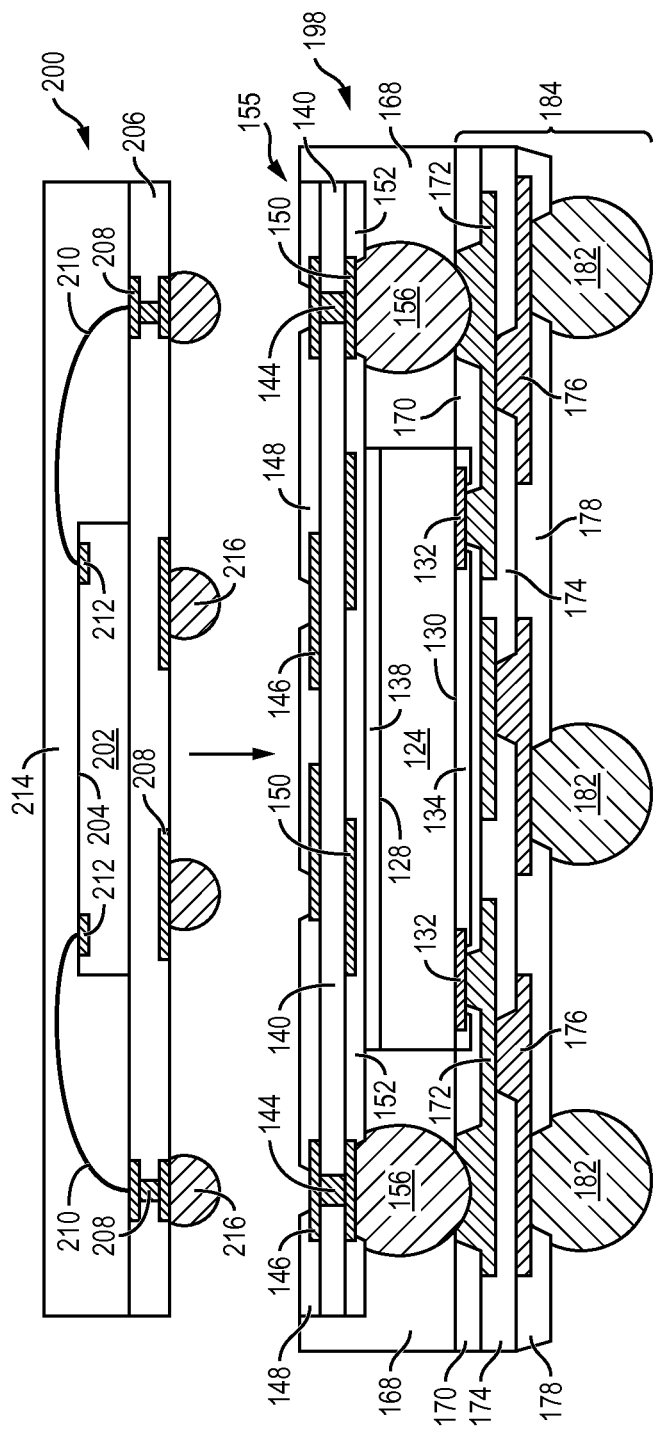
FIGS. 6a-6b illustrate a semiconductor package mounted to the Fo-WLCSP with dual-sided interconnect structures.

In FIG. 5i, substrate 155 is laminated and backgrinding or support tape 186 is removed. Semiconductor die 124 are singulated through encapsulant 168 and build-up interconnect structure 184 using saw blade or laser cutting tool 196 into individual dual-sided Fo-WLCSP 198. FIG. 6a shows Fo-WLCSP 198 after singulation. Semiconductor die 124 is electrically connected through build-up interconnect structure 184 and bumps 156 to substrate 155 for connection to external devices. Substrate 155 and build-up interconnect structure 184 provide vertical and lateral interconnect for semiconductor die 124 on opposite sides (dual sides) of Fo-WLCSP 198. Substrate 155 is formed at a different time and separate from build-up interconnect structure 184. The formation and testing of substrate 155 prior to die mounting simplifies the manufacturing process and reduces cost. The later formation of build-up interconnect structure 184 with bumps 156 providing vertical interconnect between substrate 155 and the build-up interconnect structure completes the vertical and lateral interconnect for semiconductor die 124 on opposite sides of Fo-WLCSP 198.

FIG. 6a further includes semiconductor package 200 including semiconductor die 202 with active surface 204 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 204 to implement analog circuits or digital circuits, such as DSP, ASIC, memory, or other signal processing circuit. Semiconductor die 202 may also contain IPDs, such as inductors, capacitors, and resistors, for RF signal processing. In one embodiment, semiconductor die 202 is a ball grid array (BGA) type device.

Figure 6B:
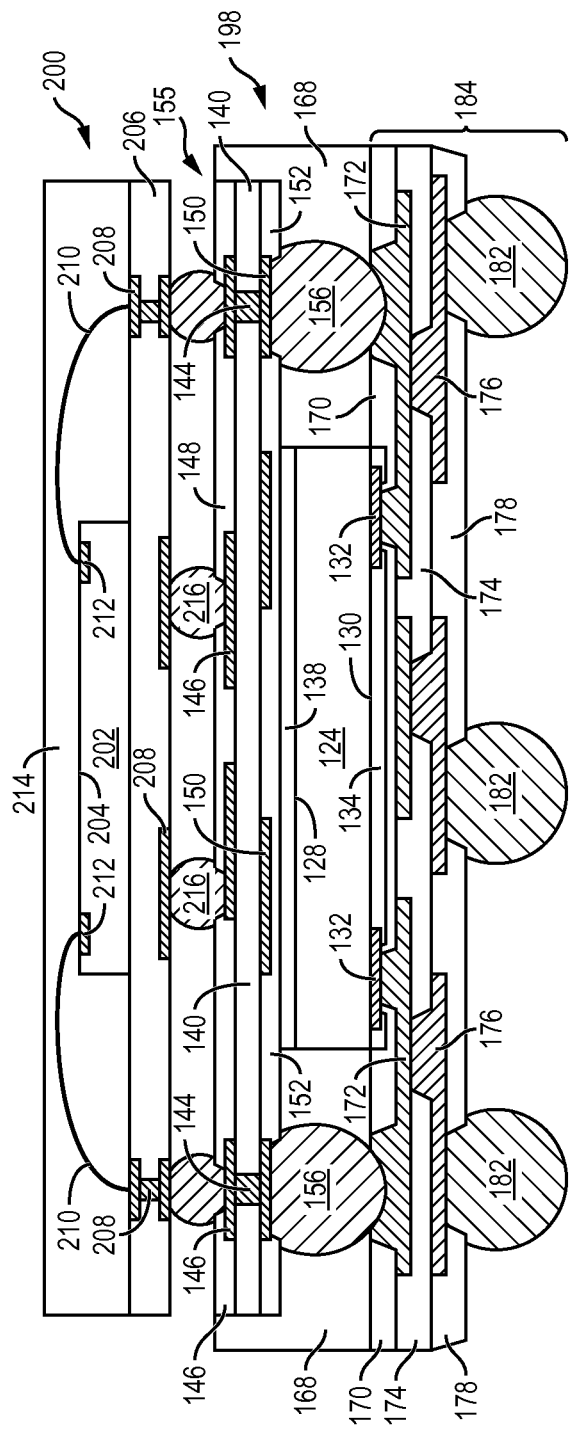

Semiconductor die 202 is mounted to substrate 206, which includes conductive traces 208. Bond wires 210 are formed between conductive traces 208 and contact pads 212 on active surface 204 of semiconductor die 202. An encapsulant 214 is deposited over semiconductor die 202, substrate 206, and bond wires 210. Bumps 216 are formed over conductive traces 208 of substrate 206 opposite semiconductor die 202. Substrate 206 is mounted to Fo-WLCSP 198 with bumps 216 oriented toward the Fo-WLCSP. FIG. 6b shows substrate 206 mounted to Fo-WLCSP 198 with bumps 216 metallurgically and electrically connected to conductive layer 146.

Figure 7:
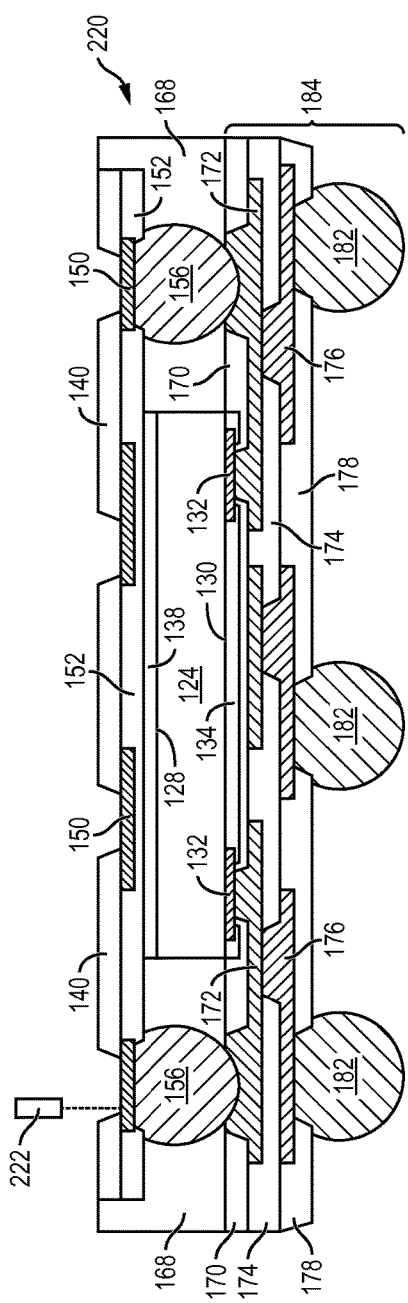
FIG. 7 illustrates the interposer substrate with a conductive layer only on one side of the substrate.

FIG. 7 illustrates an embodiment of Fo-WLCSP 220, similar to FIGS. 5a-5i, with core substrate 140, conductive layer 150, and insulating layer 152. A portion of encapsulant 168 and core substrate 140 is removed in a grinding operation to planarize the surface, similar to FIG. 5g. A portion of core substrate 140 is removed by LDA using laser 222 to expose conductive layer 150 for electrical interconnect to external semiconductor devices.

In one embodiment, core substrate 140, conductive layer 150, and insulating layer 152 are built up on a low-CTE substrate, such as Si, low-CTE glass (less than 8 ppm), and embedded together with the low-CTE substrate in encapsulant 168 during the encapsulating process for handling and warpage control purposes. The low-CTE substrate portion is removed by backgrinding to expose core substrate 140 and conductive layer 150 after forming bumps 182.

Figure 8:
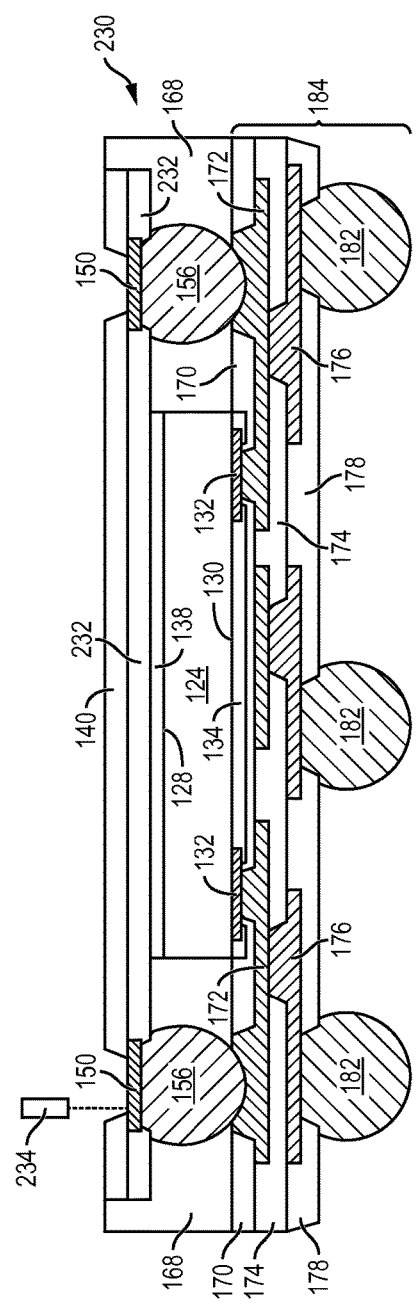
FIG. 8 illustrates the interposer substrate with a masking layer on one side of the substrate.

FIG. 8 illustrates an embodiment of Fo-WLCSP 230, similar to FIGS. 5a-5i, with core substrate 140 and conductive layer 150. A masking layer 232 formed over core substrate 140 and conductive layer 150. A portion of encapsulant 168 and core substrate 140 is removed in a grinding operation to planarize the surface, similar to FIG. 5g. A portion of core substrate 140 is removed by LDA using laser 234 to expose conductive layer 150 for electrical interconnect to external semiconductor devices.

In one embodiment, core substrate 140, conductive layer 150, and masking layer 232 are built up on a low-CTE substrate, such as Si, low-CTE glass (less than 8 ppm), and embedded together with the low-CTE substrate in encapsulant 168 during the encapsulating process for handling and warpage control purposes. The low-CTE substrate portion is removed by backgrinding to expose core substrate 140 and conductive layer 150 after forming bumps 182.

FIG. 9 illustrates an embodiment of Fo-WLCSP 240, similar to FIGS. 5a-5i, with masking layer 242 formed over core substrate 140. A portion of encapsulant 168 and core substrate 140 is removed in a grinding operation to planarize the surface, similar to FIG. 5g. A portion of core substrate 140 is removed by LDA using laser 244 to expose a side surface of bumps 156 for electrical interconnect to external semiconductor devices. Core substrate 140 and masking layer 242 are selected with proper CTE and mechanical properties to balance Fo-WLCSP 240 warpage, and increase enhance the mechanical strength of the final package.

In one embodiment, core substrate 140 and masking layer 242 are built up on a low-CTE substrate, such as Si, low-CTE glass (less than 8 ppm), and embedded together with the low-CTE substrate in encapsulant 168 during the encapsulating process for handling and warpage control purposes. The low-CTE substrate portion is removed by backgrinding to expose core substrate 140 after forming bumps 182.

FIG. 10 illustrates an embodiment of Fo-WLCSP 250, similar to FIGS. 5a-5i, with laminated protection layer 252 formed over encapsulant 168 and semiconductor die 124. A portion of laminated protection layer 252 is removed by LDA using laser 254 to expose a side surface of bumps 156 for electrical interconnect to external semiconductor devices. The laminated protection layer 252 is selected with proper CTE, thickness, and mechanical strength to balance the warpage and support of Fo-WLCSP 250.

In one embodiment, laminated protection layer 252 is built up on a low-CTE substrate, such as Si, low-CTE glass (less than 8 ppm), and embedded together with the low-CTE substrate in encapsulant 168 during the encapsulating process for handling and warpage control purposes. The low-CTE substrate portion is removed by backgrinding after forming bumps 182.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a substrate;
   a vertical interconnect structure formed in contact with a first surface of the substrate, wherein the substrate includes an opening extending from a second surface of the substrate opposite the first surface of the substrate to the vertical interconnect structure;
   a semiconductor die disposed over the first surface of the substrate;
   an encapsulant deposited over the first surface of the substrate, a side surface of the substrate, and around the semiconductor die, including a surface of the encapsulant outside the substrate coplanar with the second surface of the substrate; and
   a first interconnect structure formed over the encapsulant opposite the substrate and coupled to the semiconductor die.

2. The semiconductor device of claim 1, wherein the substrate includes:
   a first conductive layer formed over the first surface of the substrate;
   a second conductive layer formed over the second surface of the substrate; and
   a conductive via formed through the substrate and contacting the first conductive layer and second conductive layer.

3. The semiconductor device of claim 2, further including:
   a first insulating layer formed over the first surface of the substrate; and
   a second insulating layer formed over the second surface of the substrate.

4. The semiconductor device of claim 1, wherein a portion of the vertical interconnect structure extends out from the encapsulant.

5. The semiconductor device of claim 1, wherein the vertical interconnect structure includes a plurality of bumps.

6. The semiconductor device of claim 1, further including a semiconductor package disposed over the substrate and electrically connected to the substrate.

7. The semiconductor device of claim 1, wherein a surface of the semiconductor die opposite an active surface of the semiconductor die is devoid of the encapsulant.

8. The semiconductor device of claim 1, wherein the second surface of the substrate is planarized.

9. A semiconductor device, comprising:
   a substrate including,
   (a) a core material,
   (b) a first conductive layer formed over a first surface of the core material,
   (c) a second conductive layer formed over a second surface of the core material opposite the first surface, and
   (d) a conductive via formed through the core material and contacting the first conductive layer and second conductive layer;
   a bump formed over the first conductive layer;
   a semiconductor die disposed over a first surface of the substrate and first conductive layer;
   an encapsulant deposited over the substrate and around the semiconductor die including a surface of the encapsulant outside the substrate coplanar with a second surface of the substrate opposite the first surface of the substrate; and
   a first interconnect structure formed over the encapsulant opposite the substrate and coupled to the semiconductor die.

10. The semiconductor device of claim 9, wherein the substrate includes an opening extending from the second surface of the substrate to the bump.

11. The semiconductor device of claim 9, wherein the substrate further includes:
    a first insulating layer formed over the first surface of the core material; and
    a second insulating layer formed over the second surface of the core material.

12. The semiconductor device of claim 9, further including a semiconductor package disposed over the substrate and electrically connected to the substrate.

13. The semiconductor device of claim 9, wherein a surface of the semiconductor die opposite an active surface of the semiconductor die is devoid of the encapsulant.

14. The semiconductor device of claim 9, wherein a surface of the encapsulant is planarized.

15. A semiconductor device, comprising:
    a substrate including a first interconnect structure disposed within the substrate;
    a bump formed over a first surface of the substrate;
    a semiconductor die disposed over the first surface of the substrate;
    an encapsulant deposited over the first surface of the substrate and around the substrate including a surface of the encapsulant outside the substrate coplanar with a second surface of the substrate opposite the first surface; and
    a second interconnect structure formed over and coupled to the semiconductor die opposite the substrate.

16. The semiconductor device of claim 15, wherein the bump contacts the first interconnect structure and second interconnect structure.

17. The semiconductor device of claim 15, wherein the substrate includes an opening extending from the second surface of the substrate to the bump.

18. The semiconductor device of claim 15, wherein the first interconnect structure includes:
    a first conductive layer formed over the first surface of the substrate;
    a second conductive layer formed over the second surface of the substrate; and
    a conductive via formed through the substrate and contacting the first conductive layer and second conductive layer.

19. The semiconductor device of claim 18, further including:
    a first insulating layer formed over the first surface of the substrate; and
    a second insulating layer formed over the second surface of the substrate.

20. The semiconductor device of claim 15, further including a semiconductor package disposed over the substrate.

21. The semiconductor device of claim 15, wherein the second surface of the substrate is planarized.

22. The semiconductor device of claim 15, wherein the encapsulant is disposed over a side surface of the substrate.

23. The semiconductor device of claim 15, wherein a surface of the semiconductor die opposite an active surface of the semiconductor die is devoid of the encapsulant.

* * * * *